(12) United States Patent
Dai et al.

(10) Patent No.: US 12,532,567 B2
(45) Date of Patent: Jan. 20, 2026

(54) SEMICONDUCTOR COMPONENT HAVING DEFECT BARRIER REGION

(71) Applicant: VISUAL PHOTONICS EPITAXY CO., LTD., Taoyuan (TW)

(72) Inventors: Van-Truong Dai, Taoyuan (TW); Yu-Chung Chin, Taoyuan (TW); Chao-Hsing Huang, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 375 days.

(21) Appl. No.: 18/143,991

(22) Filed: May 5, 2023

(65) Prior Publication Data
US 2024/0079510 A1  Mar. 7, 2024

(30) Foreign Application Priority Data

May 6, 2022  (TW) .................................. 111117096
Jun. 30, 2022  (TW) .................................. 111124574

(51) Int. Cl.
*H10F 77/14*  (2025.01)
*H10F 77/124*  (2025.01)

(52) U.S. Cl.
CPC ......... *H10F 77/146* (2025.01); *H10F 77/124* (2025.01)

(58) Field of Classification Search
CPC ......... H01L 21/02381; H01L 21/02392; H01L 21/02395; H01L 21/02455; H01L 21/02507; H01L 21/02538; H10F 71/1272; H10F 77/124; H10F 77/146; H10H 20/811; H10H 20/815
See application file for complete search history.

(56) References Cited

U.S. PATENT DOCUMENTS

| | | | | |
|---|---|---|---|---|
| 5,856,685 | A  * | 1/1999 | Nakayama | H10D 30/4732 257/192 |
| 2002/0154675 | A1* | 10/2002 | Deng | H01S 5/18311 372/96 |
| 2002/0185655 | A1* | 12/2002 | Fahimulla | B82Y 10/00 257/E29.05 |
| 2006/0017063 | A1* | 1/2006 | Lester | H01L 21/0251 257/190 |
| 2008/0217652 | A1* | 9/2008 | Cheng | H01L 21/02505 257/E29.081 |

(Continued)

*Primary Examiner* — Fazli Erdem
(74) *Attorney, Agent, or Firm* — CKC & Partners Co., LLC

(57) ABSTRACT

The present invention is a semiconductor device having a defect blocking region. The semiconductor device includes a substrate, a defect source region, a semiconductor layer and a defect blocking region. The defect source region is on the substrate, wherein the defect source region is a metamorphic buffer layer or a buffer layer, the semiconductor layer over the defect source region, wherein a lattice constant of the semiconductor layer is different from a lattice constant of the substrate. The defect blocking region is disposed on the substrate and below the semiconductor layer, wherein the defect blocking region includes a superlattice structure, wherein at least one of two adjacent layers of the superlattice structure has strain relative to the semiconductor layer, or a lattice constant of the superlattice structure is close to or equal to the lattice constant of the semiconductor layer.

19 Claims, 10 Drawing Sheets

(56) References Cited

U.S. PATENT DOCUMENTS

| | | | |
|---|---|---|---|
| 2012/0240987 A1* | 9/2012 | King | H10F 10/142 |
| | | | 438/57 |
| 2014/0225064 A1* | 8/2014 | Khoshakhlagh | H10F 71/1276 |
| | | | 438/94 |
| 2019/0372310 A1* | 12/2019 | Chin | H01S 5/125 |
| 2021/0399153 A1* | 12/2021 | Dowd | H10F 77/12485 |
| 2024/0079510 A1* | 3/2024 | Dai | H10F 71/1272 |

* cited by examiner

SEMICONDUCTOR COMPONENT HAVING DEFECT BARRIER REGION

CROSS-REFERENCE TO RELATED APPLICATION

This application claims priority to Taiwan Application Serial Number 111117096, filed May 6, 2022, and Taiwan Application Serial Number 111124574, filed Jun. 30, 2022, the disclosures of which are incorporated herein by reference in their entireties.

BACKGROUND

Field of Invention

The present invention relates to a semiconductor device, and more particularly, to a semiconductor device having a defect blocking region.

Description of Related Art

The commonly used substrates for light-absorbing elements or light-emitting elements include GaAs substrates or InP substrates. For the GaAs substrate, when the cut-off wavelength of the light-absorbing layer of the light-absorbing element exceeds about 0.9 μm, a serious lattice mismatch may occur between the GaAs substrate and the light-absorbing layer (for example, the cut-off wavelength is 1.13 μm) of the light-absorbing element.

For the InP substrate, when the cut-off wavelength of the light-absorbing layer of the light-absorbing element exceeds about 1.7 μm, a serious lattice mismatch may occur between the InP substrate and the light-absorbing layer (for example, the cut-off wavelength is 2.15 μm) of the light-absorbing element.

Therefore, in the traditional method, a metamorphic buffer layer is first epitaxially grown on the substrate, but the metamorphic buffer layer may cause lattice disruption, leading to serious defects. Serious defects may be propagated up to the light-absorbing layer of the light-absorbing element or the cladding layer of the light-emitting element, resulting in increasing the dark current of the light-absorbing layer or cladding layer.

SUMMARY

A semiconductor device is provided. The semiconductor device includes a substrate, a defect source region, a semiconductor layer, and a defect blocking region. The defect source region is on the substrate, wherein the defect source region is a metamorphic buffer layer or a buffer layer; the semiconductor layer is over the defect source region, wherein a lattice constant of the semiconductor layer is different from a lattice constant of the substrate; and the defect blocking region is disposed on the substrate and below the semiconductor layer, wherein the defect blocking region includes a superlattice structure, wherein at least one of two adjacent layers of the superlattice structure has strain relative to the semiconductor layer, or a lattice constant of the superlattice structure is close to or equal to the lattice constant of the semiconductor layer. In this way, a large number of defects in the defect source region are prevented from being propagated into the semiconductor layer, so the defects of the semiconductor layer can be greatly reduced, and the dark current of the semiconductor layer is also reduced.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
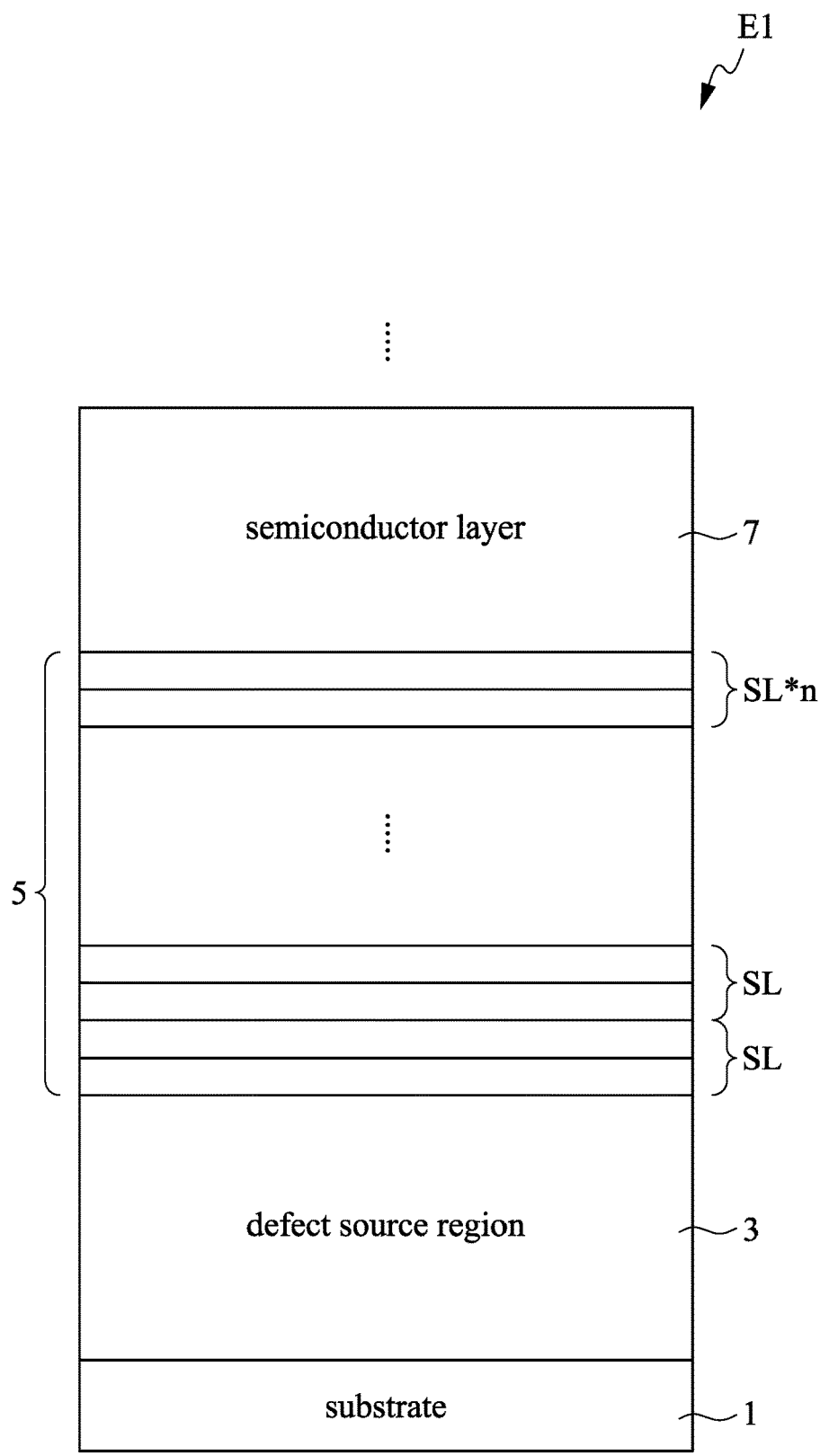
FIG. 1 is a schematic diagram of a basic embodiment herein.

The embodiment of the present invention is described in detail below with reference to the drawings and element symbols, such that persons skilled in the art is able to implement the present application after understanding the specification of the present invention.

Specific examples of components and arrangements are described below to simplify the present invention. Of course, these are merely examples and the examples are not intended to limit the scope of the present invention. For example, when a description refers to one layer above another, it may include embodiments where the layer is in direct contact with the other layer, or may include embodiments where other elements or epitaxial layers are formed between the two layers and the two layers are not in direct contact. In addition, repeated reference numerals and/or notations may be used in different embodiments, these repetitions are used to describe some embodiments simply and clearly and do not represent a specific relationship between the different embodiments and/or structures discussed.

Further, spatially relative terms, such as "underlying," "below," "lower," "overlying," "above," "upper" and the like, may be used herein for ease of description to describe one element or feature's relationship to another element(s) or feature(s) as illustrated in the figures and/or drawings. The spatially relative terms are intended to encompass different orientations of the device in use or operation in addition to the orientation depicted in the figures.

The description of the present invention provides different embodiments to illustrate the technical features of different implementations. For example, "some embodiments" referred to throughout the specification means that the specific features, structures, or characteristics described in the embodiments are included in at least one embodiment. Thus, appearances of the phrase "in some embodiments" in different passages throughout the specification are not necessarily the same embodiments.

Furthermore, the particular features, structures, or characteristics may be combined in any suitable manner in one or more embodiments. Further, for the terms "including", "having", "with", "wherein" or the foregoing transformations used herein, these terms are similar to the term "comprising" to include corresponding features.

In addition, a "layer" may be a single layer or a plurality of layers; and "a portion" of an epitaxial layer may be one layer of the epitaxial layer or a plurality of adjacent layers.

A Basic Embodiment

FIG. 1 is a schematic diagram of a basic embodiment herein. As shown in FIG. 1, the epitaxial structure E1 includes a substrate 1, a defect source region 3, a defect blocking region 5, and a semiconductor layer 7.

Please refer to FIG. 1 and FIG. 2a-FIG. 2c, the defect blocking region 5 includes a superlattice structure SL. The superlattice structure SL is a periodic alternating structure composed of at least "two materials". A pair of alternating structures of the superlattice structure SL includes a first layer L1 and a second layer L2. The defect blocking region 5 blocks the defects propagated from the defect source region 3 by strain or by matching the lattice of the superlattice structure SL to the semiconductor layer 7. The superlattice structure SL may have 10-100 pairs or 15-60 pairs of alternating structure. It should be noted that "two materials" are not limited to two different compound materials, and the "two materials" also include the same compounds but in different material composition ratios. The type of strain is determined by adjusting the material composition ratios of the compound.

Figure 2A:
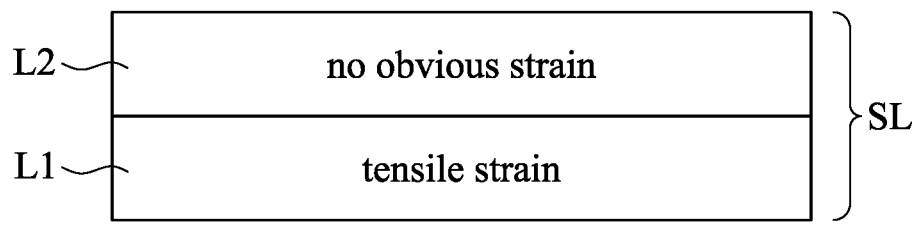
FIG. 2a is a schematic diagram of the first embodiment of the superlattice structure herein.
Figure 2B:
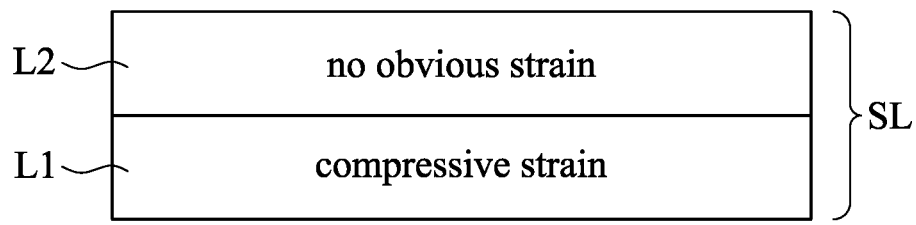
FIG. 2b is a schematic diagram of the second embodiment of the superlattice structure herein.

One way for the superlattice structure SL to block the defects propagated from the defect source region by strain is that at least one of the two adjacent layers of the superlattice structure will have strain relative to the semiconductor layer. For example, as shown in FIG. 2a, the first layer L1 and the second layer L2 have "tensile strain" and "no obvious strain" respectively. Alternatively, as shown in FIG. 2b, the first layer L1 and the second layer L2 have "compressive strain" and "no obvious strain" respectively.

Figure 2C:
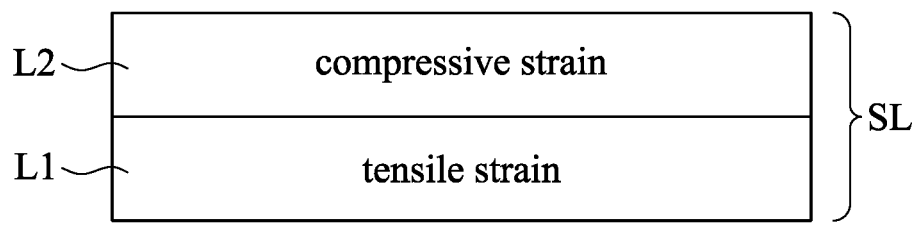
FIG. 2c is a schematic diagram of the third embodiment of the superlattice structure herein.

Another way for the superlattice structure SL to block the defects propagated from the defect source region by strain is that two adjacent layers of the superlattice structure both have strain relative to the semiconductor layer, but the strain are different. For example, as shown in FIG. 2c, the first layer L1 and the second layer L2 of the alternating structure have "tensile strain" and "compressive strain" respectively. As mentioned above, when any two adjacent layers of the superlattice have different strain, the defects propagated from the defect source region can be blocked. Preferably, if the magnitude of the tensile strain can be almost equal to that of the compressive strain, then the tensile strain and the compressive strain can be larger, and the number of the alternating structure can be more so that it can block more defects from the defect source area. In addition, if the magnitude of the tensile strain almost equal to that of the magnitude of the compressive strain, the total strain of the superlattice structure may very close to or almost equal to zero, which help the subsequent epitaxial growth process and may provide a better quality epitaxial structure.

The above-mentioned "tensile strain" indicates that the first layer L1 or the second layer L2 of the alternating structure has tensile strain relative to the semiconductor layer 7, such as the lattice constant of the first layer L1 or the second layer L2 is smaller than the lattice constant of the semiconductor layer 7. Similarly, the above-mentioned "compressive strain" indicates that the first layer L1 or the second layer L2 of the alternating structure has compressive strain relative to the semiconductor layer 7, such as the lattice constant of the first layer L1 or the second layer L2 is larger than the lattice constant of the semiconductor layer 7.

One way for the superlattice structure SL lattice-match to the semiconductor layer 7 is that the material lattice constant of the plurality of layers or each layer of the superlattice structure SL are close to or equal to the lattice constant of the semiconductor layer 7.

In some embodiments, the superlattice structure SL is selected from the group consisting of InAlAs, InGaAs, InAlGaAs, InAsP, InGaAsP, InAlAsP, InAlGaAsP, GaAsSb, AlAsSb, AlGaAsSb.

The material of the substrate 1 may be indium phosphide (InP), gallium arsenide (GaAs), or germanium (Ge).

The implementation of the defect blocking region 5 in different semiconductor devices are described below with reference to some specific embodiments herein.

Embodiment 1 (InP Substrate and 1.7 μm Light-Absorbing Layer)

Figure 3:
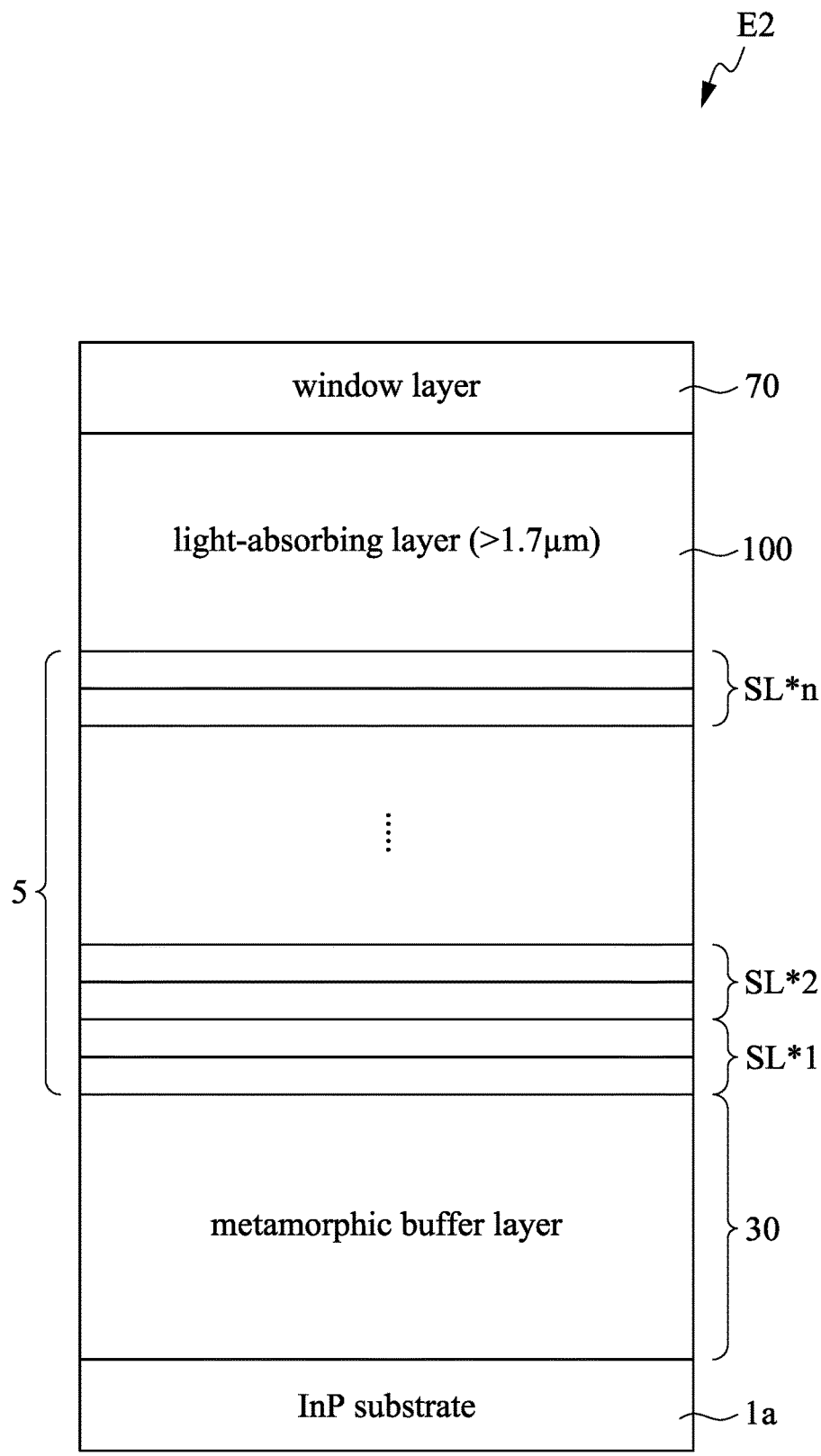
FIG. 3 is a schematic diagram of an epitaxial structure of a light-absorbing element according to an embodiment herein.

FIG. 3 is a schematic diagram of an epitaxial structure of a light-absorbing element according to an embodiment herein.

As shown in FIG. 3, the epitaxial structure E2 in FIG. 3 includes an InP substrate 1a, a metamorphic buffer layer 30, a defect blocking region 5, a light-absorbing layer 100, and a window layer 70. The InP substrate 1a and the metamorphic buffer layer 30 are merely an embodiment of the substrate 1 and the defect source region 3. The light-absorbing layer 100 is merely an embodiment of the semiconductor layer 7. In some embodiments, the defect source region 3 may also be a buffer layer.

Referring to the structure in FIG. 3, when the substrate 1a is indium phosphide (InP), and the light-absorbing cut-off wavelength (later called cut-off wavelength) of the light-absorbing material of the light-absorbing layer 100 is above 1.7 μm, 2.2 μm or 2.6 μm, the metamorphic buffer layer 30 will have serious defects due to lattice disruption. However, if the plurality of first layers and the plurality of second layers of the alternating structure of the superlattice structure SL have different strain (respectively relative to the light-absorbing layer) or the lattice constant of the plurality of layers (or each layers) in the superlattice structure SL is/are close to or equal to the lattice constant of the light-absorbing layer. The superlattice structure SL can block a large number of defects from the metamorphic buffer layer 30.

The structure in FIG. 3 can be fabricated into light-absorbing elements such as photodetectors (photoreceivers). In some embodiments, the material of the light-absorbing layer (cut-off wavelength≥1.7 μm) is selected from the group consisting of InGaAs, InGaAsN, InGaAsSb, InGaAsP, InAsSb, and InAs. The superlattice structure SL is selected from the group consisting of InAlAs, InGaAs, InAlGaAs, InAsP, InGaAsP, InAlAsP, InAlGaAsP, GaAsSb, AlAsSb, AlGaAsSb, InAlAsSb, InGaAsSb, InAlGaAsSb, InAsPSb, InGaAsPSb, InAlAsPSb, InAlGaAsPSb. The material of the metamorphic buffer layer 30 includes at least one material selected from the group consisting of InAlAs, InAlGaAs, GaAsSb, InAsP, InAlAsSb, InAlGaAsSb and InAsPSb.

Referring to FIG. 3, the lattice constant of the side in the metamorphic buffer layer 30 adjacent to the InP substrate 1a should close to the lattice constant of the InP substrate 1a. Additionally, the lattice constant of the side in the metamorphic buffer layer 30 adjacent to the light-absorbing layer 100 should close to the lattice constant of the light-absorbing layer 100 whose cut-off wavelength is above 1.7 μm. Therefore, to make the lattice constant of the metamorphic buffer layer 30 close to the lattice constant of the InP substrate 1a gradually change to close to the lattice constant of the light-absorbing layer 100, the metamorphic buffer layer 30 may include a plurality of composition-graded layers, wherein the content of one element of the plurality of composition-graded layers gradually increases as the distance from the substrate 1a increases, and the content of the other element gradually decreases. For example, in the InAlAs composition gradient layer, the content of indium (In) is increased gradually, and the content of aluminum (Al) is correspondingly decreased gradually.

Embodiment 2 (GaAs Substrate and 870 nm Light-Absorbing Layer)

Figure 4:
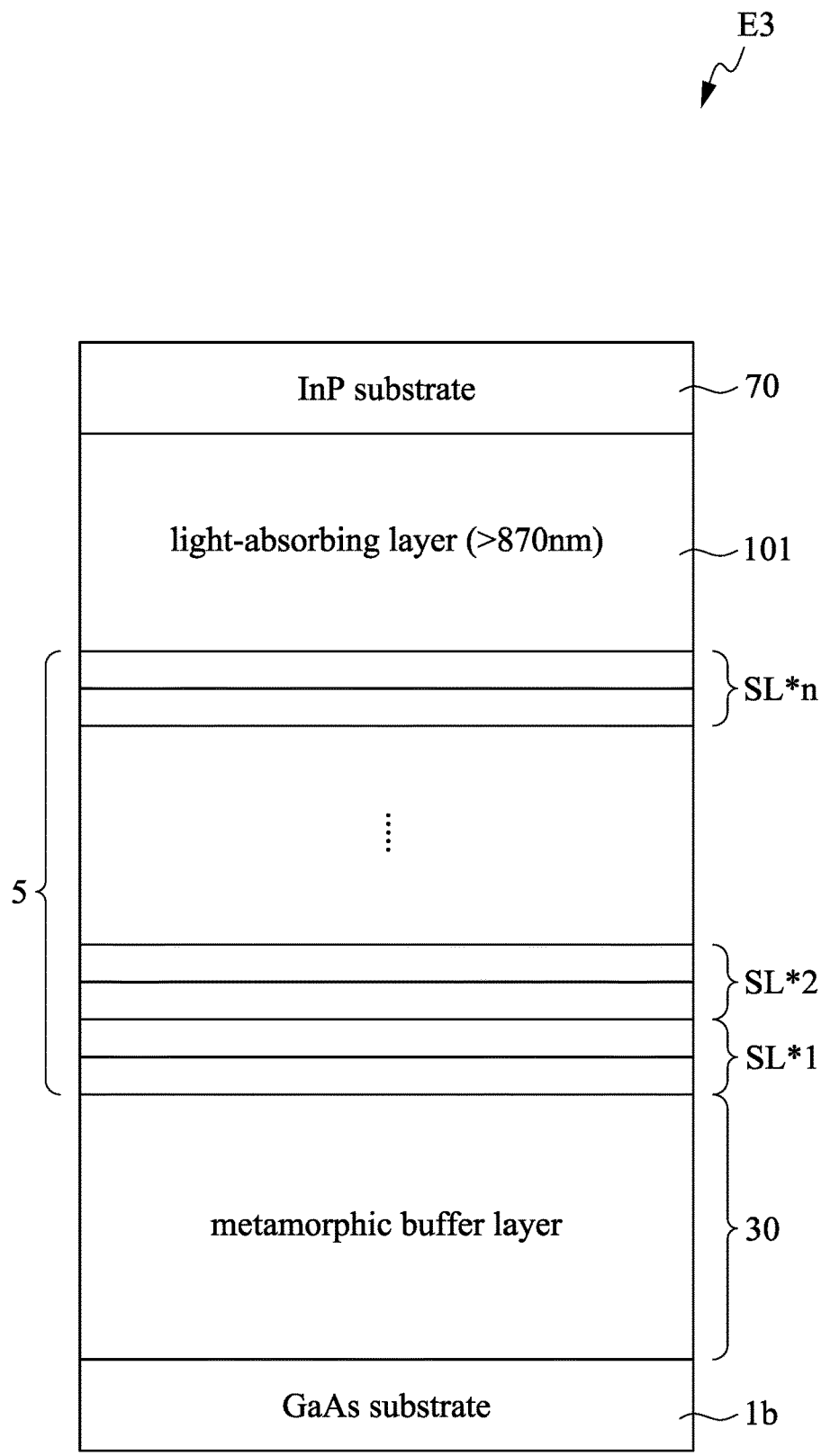
FIG. 4 is a schematic diagram of another epitaxial structure of a light-absorbing element according to an embodiment herein.

FIG. 4 is a schematic diagram of another epitaxial structure of a light-absorbing element according to an embodiment herein. Please refer to the epitaxial structure E3 in FIG. 4, when the substrate is a GaAs (gallium arsenide) substrate 1b and the cut-off wavelength of the light-absorbing material of the light-absorbing layer 101 is above 870 nm, the metamorphic buffer layer 30 will have serious defects. However, if the first layers and the second layers of the alternating structure in the superlattice structure SL can have different strain or the lattice constants of the layers of the superlattice structure SL are close to or equal to the lattice constant of the light-absorbing layer 101. The superlattice structure SL can block numerous serious defects from the metamorphic buffer layer 30.

Referring to FIG. 4, the material of the light-absorbing layer 101 is selected from the group consisting of IGaAs, InGaAsN, InGaAsSb, InGaAsP, InAsSb, and InAs. The superlattice structure SL may include InAlAs, InGaAs, InAlGaAs, InAsP, InGaAsP, InAlAsP, InAlGaAsP, GaAsSb, AlAsSb, AlGaAsSb, InAlAsSb, InGaAsSb, InAlGaAsSb, InAsPSb, InGaAsPSb, InAlAsPSb, and InAlGaAsPSb. The material of the metamorphic buffer layer 30 includes the material selected from the group consisting of InGaP, InAlAs, InAlGaAs, InGaAs, GaAsSb, InAsP, InP, InGaPSb, InAlAsSb, InAlGaAsSb, InGaAsSb, InAsPSb, and InPSb.

Embodiment 3 (InP Substrate, 1.7 μm Light-Absorbing Layer, and Cap Layer)

Figure 5:
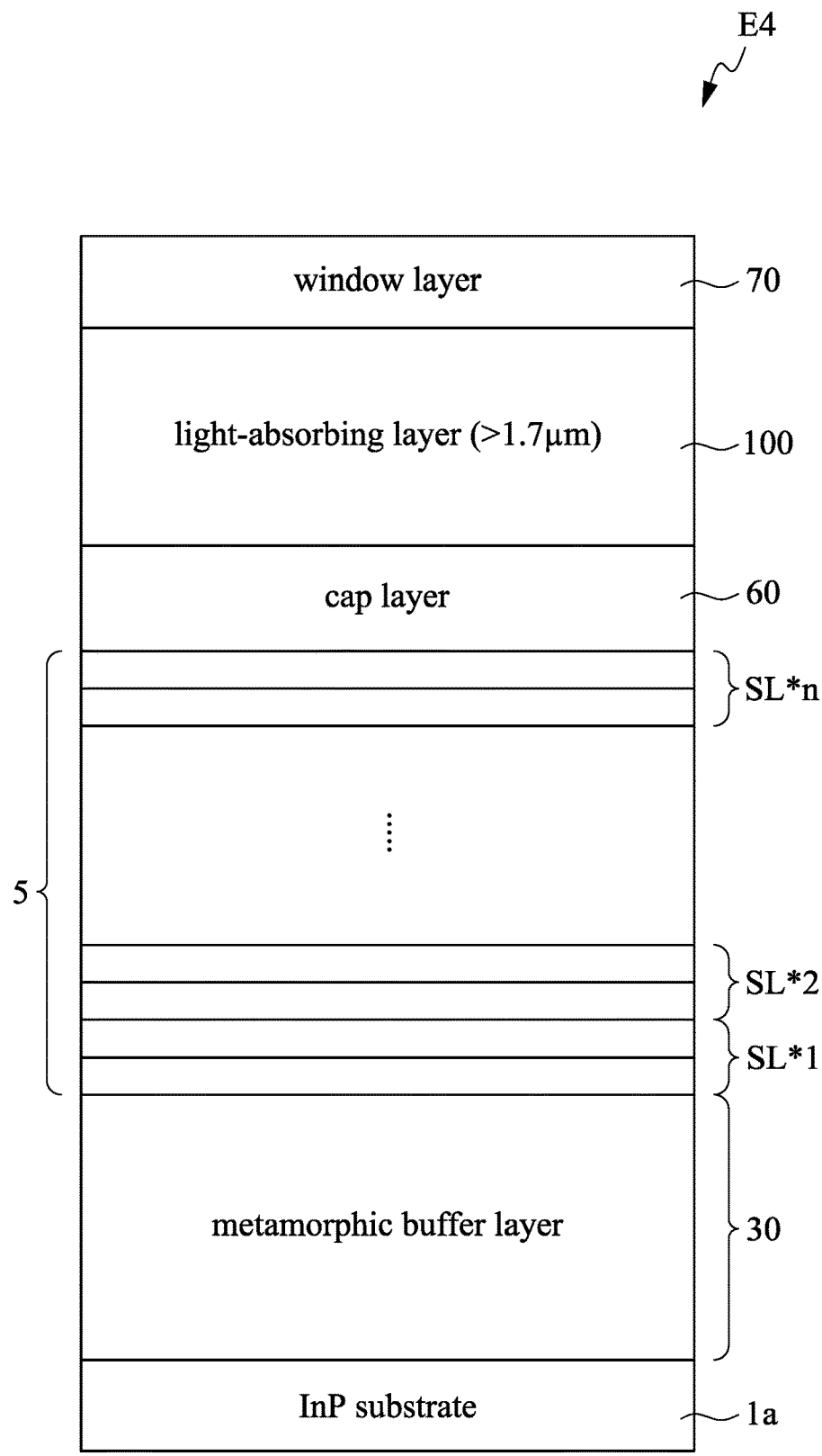
FIG. 5 is a schematic diagram of an epitaxial structure in which a cap layer is disposed on a defect blocking region according to an embodiment herein.

FIG. 5 is a schematic diagram of an epitaxial structure in which a cap layer 60 is disposed on a defect blocking region 5 according to an embodiment herein. The epitaxial structure E4 of FIG. 5 is further provided with a cap layer 60 in the epitaxial structure E2 of FIG. 3. As shown in FIG. 5, the cap layer 60 is disposed between the defect blocking region 5 and the light-absorbing layer 100. The cap layer 60 includes at least one material selected from the group consisting of InAlAs, InAsP, InGaAs, InAlGaAs, InGaAsP, InAlAsP, InAlGaAsP, GaAsSb, AlAsSb, and AlGaAsSb, InAlAsSb, InAsPSb, InGaAsSb, InAlGaAsSb, InGaAsPSb, InAlAsPSb, and InAlGaAsPSb. The preferred material of the cap layer 60 depends on the material of the light-absorbing layer 100. That is, the lattice constant of the material of the cap layer 60 does not have a large lattice mismatch (at room temperature) with the lattice constant of the light-absorbing material, or the cap layer 60 and the light-absorbing layer 100 are almost lattice matched.

In an embodiment, the cap layer 60 may also be disposed in the defect blocking region 5.

Embodiment 4 (GaAs Substrate and Cap Layer)

Figure 6:
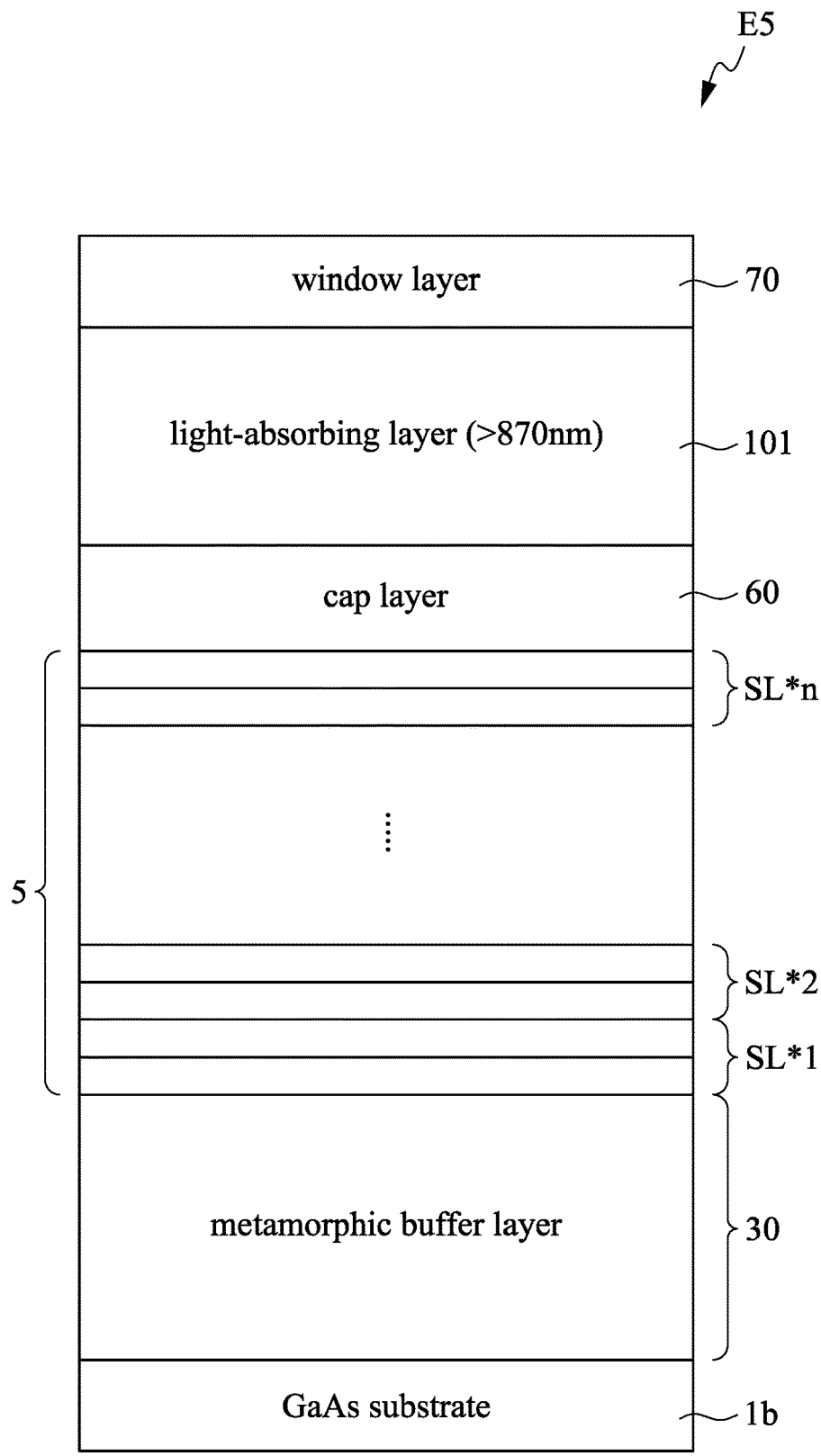
FIG. 6 is a schematic diagram of another epitaxial structure in which a cap layer is disposed on a defect blocking region according to an embodiment herein.

FIG. 6 is a schematic diagram of another epitaxial structure in which a cap layer 60 is disposed on a defect blocking region 5 according to an embodiment herein. The epitaxial structure E5 of FIG. 6 is further provided with a cap layer 60 disposed in the epitaxial structure of FIG. 4. The cap layer 60 includes at least one material selected from the group consisting of InAlAs, InAsP, InGaP, InGaAs, InAlGaAs, InGaAsP, InAlAsP, InAlGaAsP, GaAsSb, AlAsSb, AlGaAsSb, InAlAsSb, InAsPSb, InGaPSb, InGaAsSb, InAlGaAsSb, InGaAsPSb, InAlAsPSb, and InAlGaAsPSb.

Embodiment 5

Figure 7A:
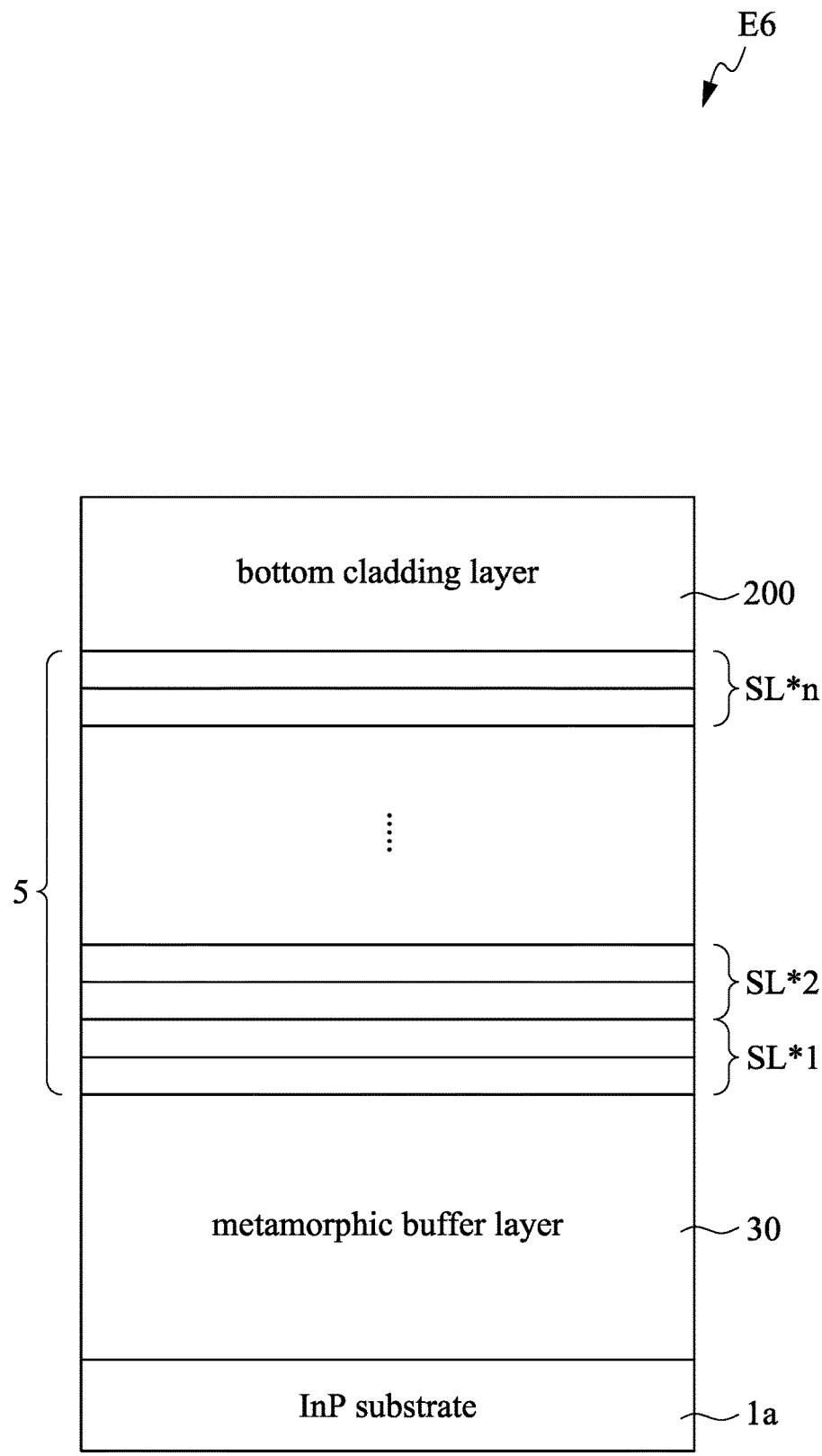
FIG. 7a is a schematic diagram of an epitaxial structure of a light-emitting device according to an embodiment herein.

FIG. 7a is a schematic diagram of an epitaxial structure of a light-emitting device according to an embodiment herein. As shown in FIG. 7a, the epitaxial structure E6 in FIG. 7a includes an InP substrate 1a, a metamorphic buffer layer 30, a defect blocking region 5, and a bottom cladding layer 200. The bottom cladding layer 200 is merely an embodiment of the semiconductor layer 7.

The material of the bottom cladding layer 200 is selected from the group consisting of InAlAs, InGaAs, InAlGaAs, InAsP, InGaAsP, InAlAsP, InAlGaAsP, GaAsSb, AlAsSb, AlGaAsSb and combinations thereof.

Figure 7B:
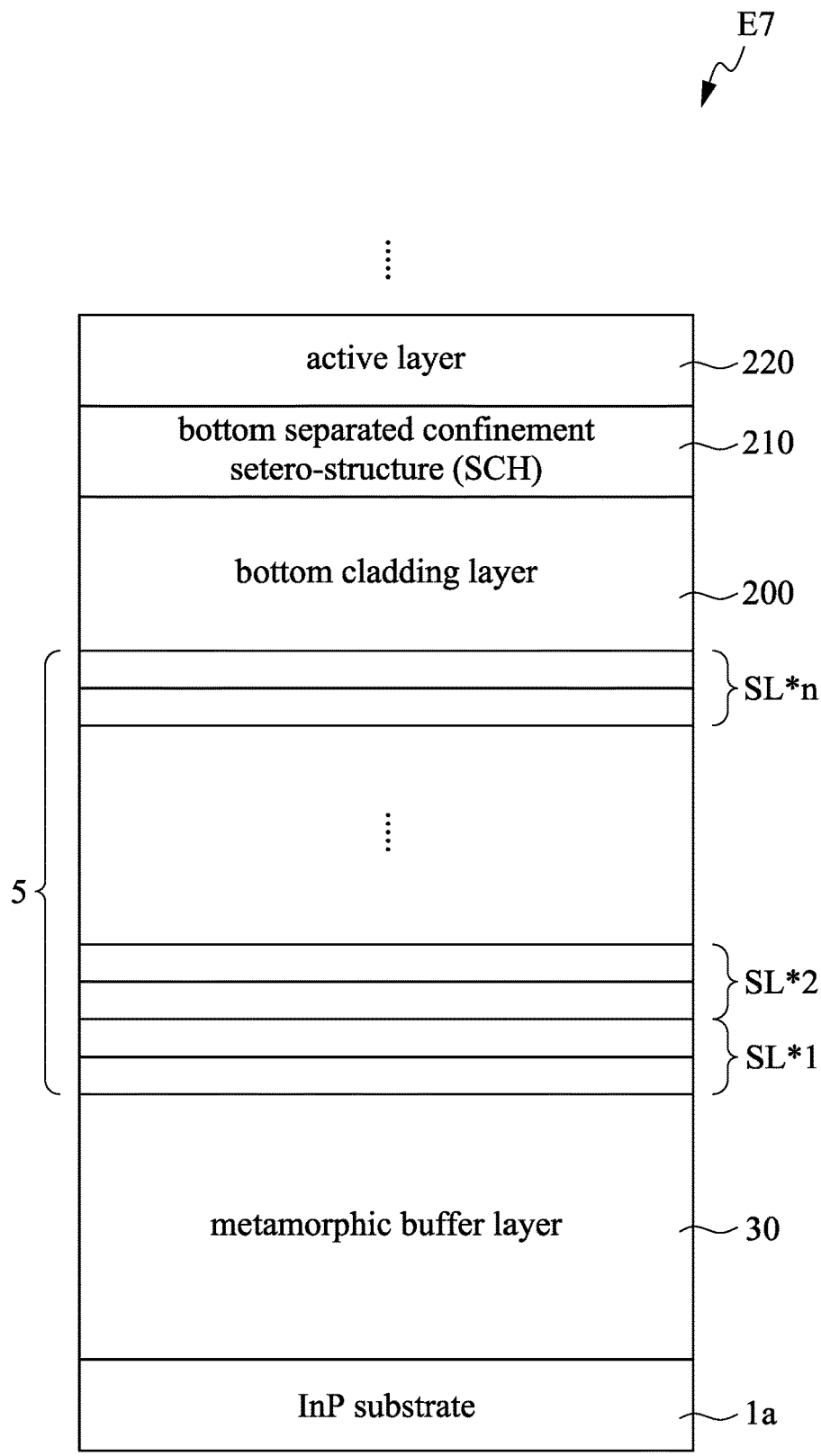
FIG. 7b is a schematic diagram of another epitaxial structure of the light-emitting element according to an embodiment herein.

The structure in FIG. 7a can be fabricated into light-emitting elements such as light-emitting diodes, laser diodes, and edge-emitting laser diodes. As shown in FIG. 7b, the bottom separated confinement hetero-structure (SCH) 210, the active layer 220, etc., can be epitaxially grown on the bottom cladding layer 200. Therefore, the epitaxial structure E7 in FIG. 7b can be used to fabricate light-emitting elements such as edge-emitting laser diodes or light-emitting diodes.

In some embodiments, the defect blocking region 5 may also be disposed in the metamorphic buffer layer 30. In related embodiments of the light emitting device, a cap layer 60 can be further provided between the defect blocking region 5 and the bottom cladding layer 200.

It can be known from the above embodiments that the semiconductor layer can serve as the light-absorbing layer for the light-absorbing elements, as well as the cladding layer for the light-emitting elements. Of course, it can also serve as the semiconductor layer for other semiconductor devices. Therefore, the epitaxial structure herein can also be fabricated into semiconductor devices such as transistors.

Figure 8:
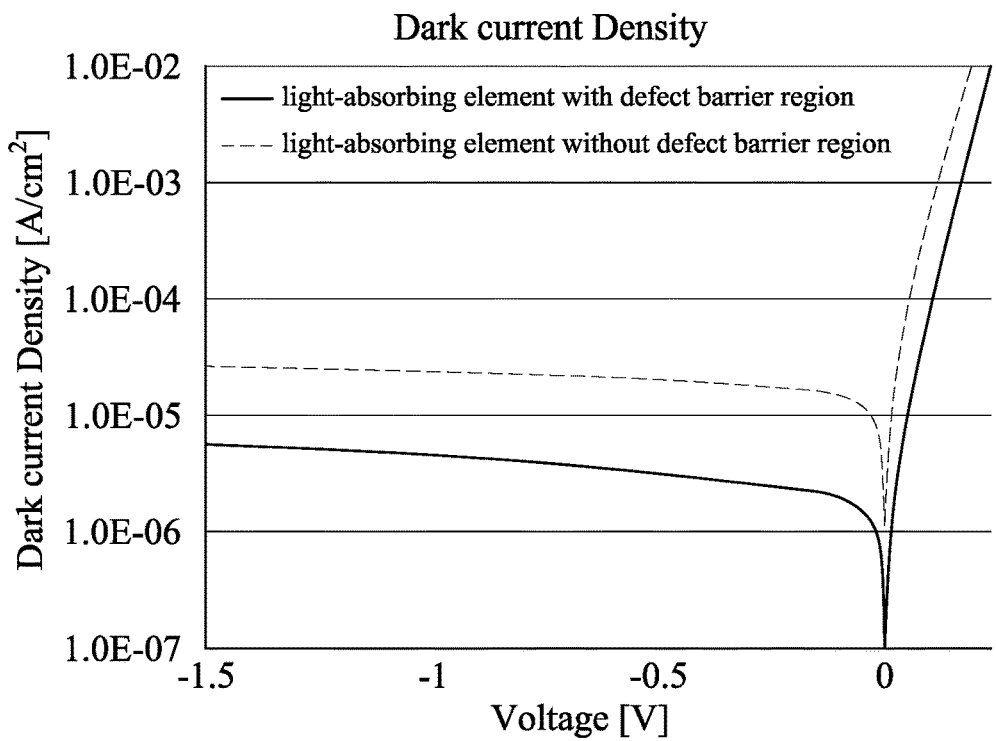
FIG. 8 is a schematic diagram showing dark current densities of an embodiment and a control group.

FIG. 8 is a schematic diagram showing the dark current densities of an embodiment and a control group. Both the embodiment and the control group are light-absorbing elements with a cut-off wavelength of 2.15 μm. Both the embodiment and the control group use the epitaxial structure E4 in FIG. 5 to measure the dark current density, but the control group does not have the defect blocking region 5 in FIG. 5. The material of the light-absorbing layer 100 of the embodiment and the control group are both $In_{0.715}GaAs$, and the cut-off wavelength, thickness and, silicon doping concentration of the light-absorbing layer 100 are respectively about 2.15 µm, 35000 nm, and less than $3\times10^{16}$ cm$^{-3}$. The metamorphic buffer layer 30 and the cap layer 60 are InAsP and $In_{0.715}AlAs$, respectively. The superlattice structure SL of the defect blocking region 5 of the embodiment includes about 20 pairs of alternating structures, and the material of the alternating structures is InAlAs, the superlattice structure SL blocks defects in the form of strain, and the total strain of the superlattice structure SL is close to zero. As can be seen from the results in FIG. 8, when the reverse bias voltage is about "−0.01V", the dark current density of the embodiment is about $5.66\times10^{-7}$ (A/cm$^2$), the dark current density of the control group is $39\times10^{-7}$ (A/cm$^2$), and the dark current density of the embodiment is about 6.9 times different from the control group.

Figure 9:
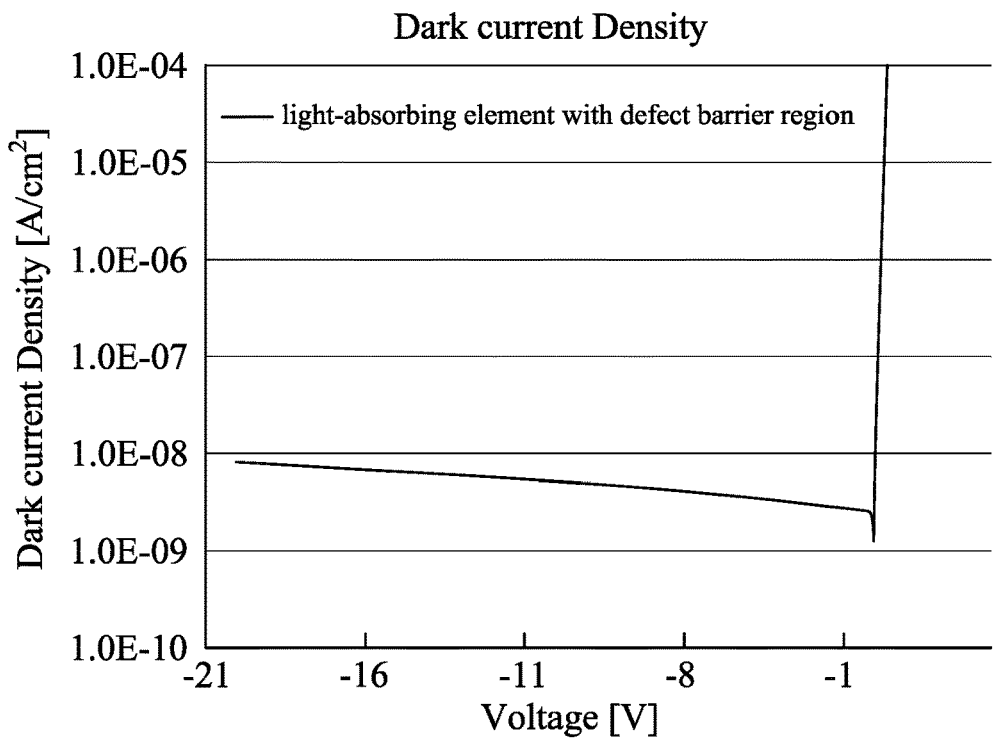
FIG. 9 is a schematic diagram showing the dark current density of the epitaxial structure shown in FIG. 6.

FIG. 9 is a schematic diagram showing the dark current density of the epitaxial structure shown in FIG. 6, wherein the material of the light-absorbing layers 101 in FIG. 6 are all $In_{0.715}GaAs$, and the cut-off wavelength, thickness, and silicon doping concentration of the light-absorbing layers 101 are respectively about 1.13 µm, 35000 nm, and less than $1\times10^{16}$ cm$^{-3}$. The superlattice structure SL of the defect blocking region 5 of this embodiment includes about 20 pairs of alternating structures, and the material of the alternating structures is InAlAs, the superlattice structure SL blocks defects in the form of strain, and the total strain of the superlattice structure SL is close to zero. When the reverse bias is about "−5V", the dark current density is $3.95\times10^{-9}$ (A/cm$^2$).

In some embodiments, the material of the window layer 70 is not limited to InAlAs, InAsP can also be used.

Figure 10:
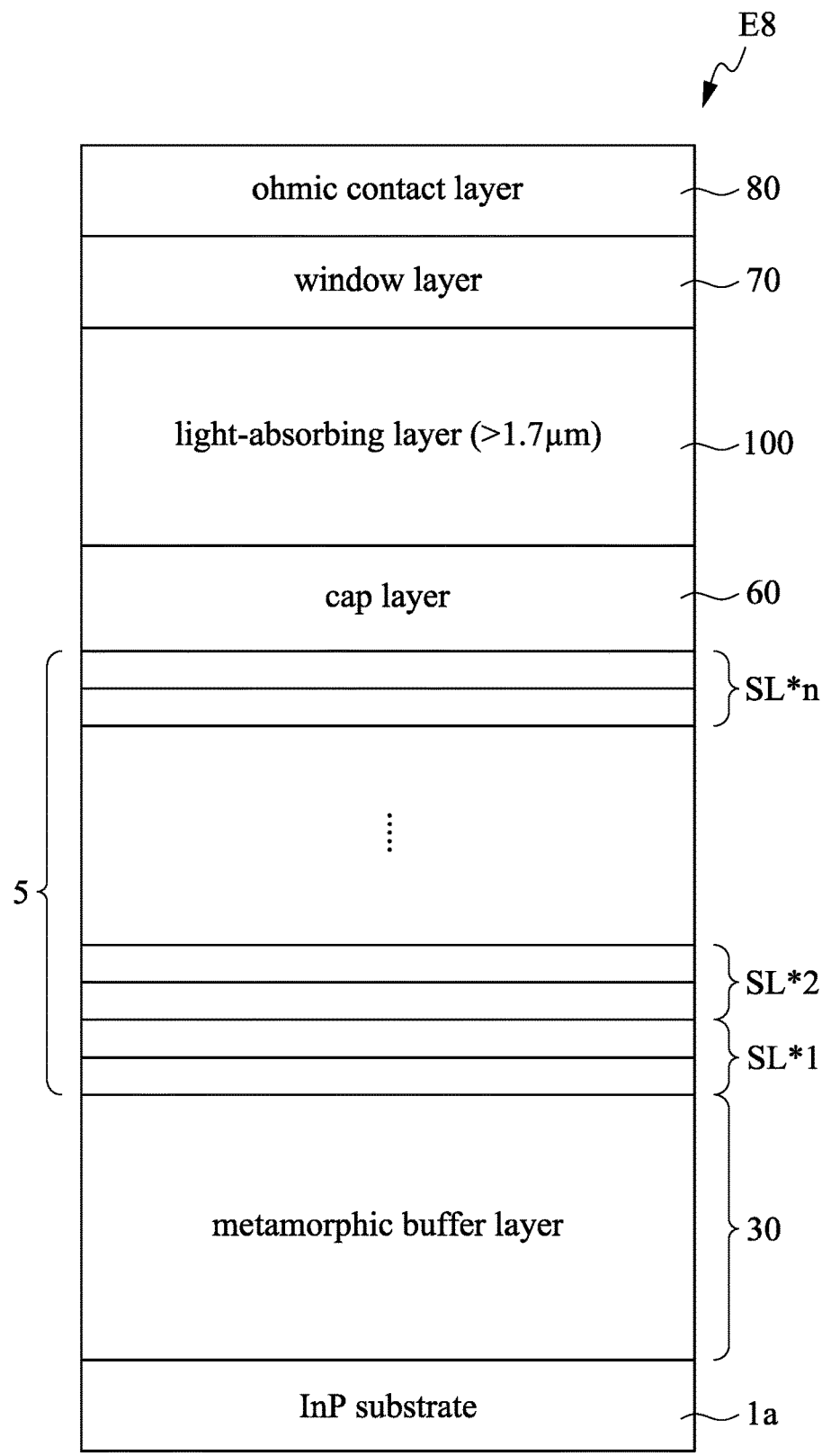
FIG. 10 is a schematic diagram of disposing an ohmic contact layer on a light-absorbing element according to an embodiment herein.

Referring to FIG. 10, FIG. 10 is a schematic diagram of disposing an ohmic contact layer 80 on a light-absorbing element according to an embodiment herein. The epitaxial structure E8 of FIG. 10 is further provided with an ohmic contact layer 80 disposed on the epitaxial structure E4 of FIG. 5, and the ohmic contact layer 80 is disposed on the window layer 70. The configuration of the ohmic contact layer 80 is dependent on the requirements of the ohmic contact characteristic. If better ohmic contact characteristic is not necessary, the window layer 70 can also function as the ohmic contact layer 80.

What is claimed is:

1. A light-absorbing element, comprising:
a substrate;
a defect source region on the substrate, wherein the defect source region is a metamorphic buffer layer or a buffer layer;
a light-absorbing layer over the defect source region, wherein a lattice constant of the light-absorbing layer is different from a lattice constant of the substrate, and the light-absorbing layer comprises a light-absorbing material; and
a defect blocking region between the defect source region and the light-absorbing layer, wherein the defect blocking region comprises a superlattice structure which is a periodic alternating structure, wherein at least one of two adjacent layers of the superlattice structure has strain relative to the light-absorbing layer, or a lattice constant of the superlattice structure is close to or equal to the lattice constant of the light-absorbing layer.

2. The light-absorbing element of claim 1, wherein the substrate is an InP substrate.

3. The light-absorbing element of claim 2, wherein the light-absorbing material has a cut-off wavelength, and the cut-off wavelength is above 1.7 µm.

4. The light-absorbing element of claim 3, wherein the light-absorbing layer comprises at least one material selected from the group consisting of InGaAs, InGaAsN, InGaAsSb, InGaAsP, InAsSb and InAs.

5. The light-absorbing element of claim 2, wherein the metamorphic buffer layer comprises at least one material selected from the group consisting of InAlAs, InAlGaAs, GaAsSb, InAsP, InAlAsSb, InAlGaAsSb, and InAsPSb.

6. The light-absorbing element of claim 2, further comprising a cap layer in or on the defect blocking region, wherein the cap layer comprises at least one material selected from the group consisting of InAlAs, InAsP, InGaAs, InAlGaAs, InGaAsP, InAlAsP, InAlGaAsP, GaAsSb, AlAsSb, AlGaAsSb, InAlAsSb, InAsPSb, InGaAsSb, InAlGaAsSb, InGaAsPSb, InAlAsPSb, and InAlGaAsPSb.

7. The light-absorbing element of claim 1, wherein the substrate is a GaAs substrate or a Ge substrate.

8. The light-absorbing element of claim 7, wherein the light-absorbing material has a cut-off wavelength, and the cut-off wavelength is above 870 nm.

9. The light-absorbing element of claim 8, wherein the light-absorbing layer comprises at least one material selected from the group consisting of InGaAs, InGaAsN, InGaAsSb, InGaAsP, InAsSb, and InAs.

10. The light-absorbing element of claim 7, wherein the metamorphic buffer layer comprises at least one material selected from the group consisting of InGaP, InAlAs, InAlGaAs, InGaAs, GaAsSb, InAsP, InP, InGaPSb, InAlAsSb, InAlGaAsSb, InGaAsSb, InAsPSb, and InPSb.

11. The light-absorbing element of claim 7, further comprising a cap layer in or on the defect blocking region, wherein the cap layer comprises at least one material selected from the group consisting of InAlAs, InAsP, InGaP, InGaAs, InAlGaAs, InGaAsP, InAlAsP, InAlGaAsP, GaAsSb, AlAsSb, AlGaAsSb, InAlAsSb, InAsPSb, InGaPSb, InGaAsSb, InAlGaAsSb, InGaAsPSb, InAlAsPSb, and InAlGaAsPSb.

12. The light-absorbing element of claim 1, wherein at least one of the two adjacent layers of the superlattice structure has tensile strain or compressive strain relative to the light-absorbing layer.

13. The light-absorbing element of claim 1, wherein the two adjacent layers of the superlattice structure have strain relative to the light-absorbing layer and the strain of the two adjacent layers are different.

14. The light-absorbing element of claim 13, wherein the two adjacent layers have tensile strain and compressive strain relative to the light-absorbing layer.

15. The light-absorbing element of claim 14, wherein a total strain of the superlattice structure is close to or equal to zero.

16. The light-absorbing element of claim 1, wherein the superlattice structure is selected from the group consisting of InAlAs, InGaAs, InAlGaAs, InAsP, InGaAsP, InAlAsP, InAlGaAsP, GaAsSb, AlAsSb, AlGaAsSb, InAlAsSb, InGaAsSb, InAlGaAsSb, InAsPSb, InGaAsPSb, InAlAsPSb, InAlGaAsPSb and combinations thereof.

17. The light-absorbing element of claim 1, wherein the light-absorbing element is a photodetector.

18. The light-absorbing element of claim 1, further comprising a window layer disposed on the light-absorbing layer.

19. The light-absorbing element of claim 18, further comprising an ohmic contact layer disposed on the window layer.

\* \* \* \* \*